(12) United States Patent
Kamiya et al.

(10) Patent No.: US 9,332,645 B2
(45) Date of Patent: May 3, 2016

(54) ELECTRONIC PART AND ELECTRONIC CONTROL UNIT

(71) Applicants: DENSO CORPORATION, Kariya, Aichi-pref. (JP); Murata Manufacturing Co., Ltd., Nagaokakyo-shi, Kyoto-fu (JP)

(72) Inventors: Yuuto Kamiya, Takahama (JP); Toru Itabashi, Anjo (JP); Ryoichi Shiraishi, Okazaki (JP); Yuki Mikami, Kariya (JP); Akihiro Yanagisawa, Toyohashi (JP); Shigeki Nishiyama, Nagaokakyo (JP)

(73) Assignees: DENSO CORPORATION, Kariya (JP); Murata Manufacturing Co., Ltd., Nagaokakyo-shi (JP)

( * ) Notice: Subject to any disclaimer, the term of this patent is extended or adjusted under 35 U.S.C. 154(b) by 264 days.

(21) Appl. No.: 14/190,297

(22) Filed: Feb. 26, 2014

(65) Prior Publication Data

US 2014/0240885 A1    Aug. 28, 2014

(30) Foreign Application Priority Data

Feb. 28, 2013  (JP) .................................. 2013-038361

(51) Int. Cl.
*H02H 5/04*     (2006.01)
*H05K 1/18*     (2006.01)
*H05K 3/34*     (2006.01)

(52) U.S. Cl.
CPC .............. *H05K 1/181* (2013.01); *H05K 3/3426* (2013.01); *H05K 2201/10015* (2013.01); *H05K 2201/10181* (2013.01); *H05K 2201/10636* (2013.01); *H05K 2201/10757* (2013.01); *H05K 2201/10818* (2013.01); *H05K 2201/10848* (2013.01); *H05K 2201/10946* (2013.01); *Y02P 70/611* (2015.11)

(58) Field of Classification Search
CPC .............. H01H 85/0241; H05K 1/181; H05K 2201/10818; H02H 3/08
USPC ........................................................ 361/93.8
See application file for complete search history.

(56) References Cited

U.S. PATENT DOCUMENTS 6,288,887 B1 *  9/2001  Yoshida ............... H05K 3/3426
                                          361/306.1
6,903,920 B1 *  6/2005  Prymak .................. H01G 2/065
                                          361/306.1

(Continued)

FOREIGN PATENT DOCUMENTS

JP      2006-024825 A    1/2006
JP      2007-311467 A   11/2007

OTHER PUBLICATIONS

U.S. Appl. No. 14/190,249, filed Feb. 26, 2014, Mikami et al.

(Continued)

*Primary Examiner* — Thienvu Tran
*Assistant Examiner* — Lucy Thomas
(74) *Attorney, Agent, or Firm* — Posz Law Group, PLC

(57) ABSTRACT

A main body of an electronic part has multiple electrodes, to which multiple terminals are respectively connected. The terminals include a fuse terminal and a normal terminal, each of which extends from the main body to a printed board so that the main body is supported at a position above and separated from a board surface of the printed board. The fuse terminal has an intermediate portion between an electrode-connected portion and a land-connected portion. The intermediate portion has a cut-off portion having a smaller width than other portions of the fuse terminal, so that the cut-off portion is melted down when excess current flows in the fuse terminal. The intermediate portion extends in a direction parallel to the board surface or in a direction inclined to the board surface at an angle smaller than 90 degrees.

12 Claims, 11 Drawing Sheets

(56) References Cited

U.S. PATENT DOCUMENTS

| | | | |
|---|---|---|---|
| 7,164,573 B1 * | 1/2007 | Prymak | H01G 2/16 361/306.1 |
| 7,365,957 B2 * | 4/2008 | Togashi | H01G 2/065 361/306.3 |
| 2012/0200970 A1 | 8/2012 | Itabashi et al. | |

OTHER PUBLICATIONS

U.S. Appl. No. 14/190,210, filed Feb. 26, 2014, Itabashi et al.
U.S. Appl. No. 14/190,250, filed Feb. 26, 2014, Shiraishi et al.
U.S. Appl. No. 14/190,280, filed Feb. 26, 2014, Murowaki et al.
U.S. Appl. No. 14/190,299, filed Feb. 26, 2014, Itabashi et al.

* cited by examiner

ELECTRONIC PART AND ELECTRONIC CONTROL UNIT

CROSS REFERENCE TO RELATED APPLICATION

This application is based on Japanese Patent Application No. 2013-038361 filed on Feb. 28, 2013, the disclosure of which is incorporated herein by reference.

FIELD OF TECHNOLOGY

The present disclosure relates to an electronic part mounted to a printed board and an electronic control unit having the electronic part.

BACKGROUND

A printed board having a pattern fuse, which is a part of wiring patterns formed in the printed board, is known in the art, for example, as disclosed in Japanese Patent Publication No. 2007-311467.

The pattern fuse is generally so formed as to be narrower than a remaining part of the wiring patterns. Therefore, for example, when a short-circuit occurs in an inside of an electronic device or an electronic part and thereby excess current flows, the pattern fuse is melted down due to heat generation in order that an electric pathway is cut off.

In a case of the pattern fuse, it is necessary to individually design the pattern fuses when the pattern fuses are used for different types of electronic parts or when the pattern fuses are used to the same type of the electronic part but ratings of the electronic parts are different from each other. As a result, it is difficult to commonalize or standardize the printed boards for different types of electronic control units. In other words, it is difficult to commonalize the printed boards and to simply change the electronic parts to be mounted to the printed board in order to use the same type of the printed board for the different types of the electronic control units (variation products).

In addition, it is difficult to make a size of the printed board as well as the electronic control unit smaller, because the pattern fuse (or pattern fuses) is formed in the printed board as a part of the wiring patterns.

In addition, since the pattern fuse is formed on a board surface of the printed board, it is a problem that melted-down portions of the pattern fuse may be connected again after the pattern fuse is melted down. In particular, re-connection of the melted-down portions is more likely to occur due to density growth of the printed board.

SUMMARY OF THE DISCLOSURE

The present disclosure is made in view of the above problems. It is an object of the present disclosure to provide an electronic part and an electronic control unit having the electronic part, according to which it is possible to commonalize and/or standardize a printed board, to which the electronic parts are mounted, and to make a size of the printed board smaller. In addition, re-connection of melted-down portion of a fuse portion is prevented.

According to a feature of the present disclosure, an electronic part mounted to a printed board is composed of;

a main body arranged at a position above and separated from a board surface of the printed board, wherein the main body has at least one electronic element and multiple electrodes for the electronic element; and multiple terminals, each of which is connected at its one end to each of the electrodes and electrically and mechanically connected at its other end to a land formed in the printed board, wherein each of the terminals extends from the main body toward the printed board so as to hold the main body at the position above and separated from the board surface in a condition that each of the terminals is electrically and mechanically connected to the respective electrodes and the respective lands.

In the above electronic part, each of the terminals has an electrode-connected portion electrically and mechanically connected to the corresponding electrode, a land-connected portion electrically and mechanically connected to the corresponding land, and an intermediate portion for connecting the electrode-connected portion and the land-connected portion with each other.

The terminals include at least one fuse terminal, wherein the fuse terminal has a first connecting portion at least as a part of the intermediate portion and the first connecting portion extends in a direction parallel to the board surface or in a direction inclined with respect to the board surface by an angle smaller than 90 degrees.

The fuse terminal further has a cut-off portion formed in the first connecting portion, and the cut-off portion, which has a width smaller than that of other portions of the fuse terminal, is melted down due to heat generation by excess current. The fuse terminal has tapered portions at both sides of the cut-off portion, so that the cut-off portion is respectively connected to the electrode-connected portion and the land-connected portion via the respective tapered portions.

According to the above feature, multiple terminals are connected to the main body of the electronic part and one of the terminals is composed of the fuse terminal having the cut-off portion. It is, therefore, possible to commonalize the printed board, which can be used for different types of the electronic control units. In addition, it is possible to make the size of the printed board as well as the electronic control unit smaller by such a volume of a pattern fuse, because the pattern fuse is not necessary in the present disclosure.

The fuse terminal has the first connecting portion as a part of the intermediate portion, wherein the cut-off portion is formed in the first connecting portion. In other words, the cut-off portion is formed at such a position above and separated from the board surface of the printed board. It is, therefore, possible to prevent the cut-off portion from being re-connected after the cut-off portion is melted down.

In particular, according to one of embodiments of the present disclosure, since the first connecting portion extends in a direction along the board surface, a gap is formed at a position of the cut-off portion in the direction along the board surface when the cut-off portion is melted down. Therefore, it is possible to more effectively prevent re-connection of the fuse terminal, when compared with a structure in which the cut-off portion is formed in the intermediate portion extending in a direction perpendicular to the board surface.

According to another feature of the present disclosure, the fuse terminal has a second connecting portion as another part of the intermediate portion, in addition to the first connecting portion. The second connecting portion extends in the direction perpendicular to the board surface. The second connecting portion is connected to the first connecting portion. The electrode-connected portion is connected to the first connecting portion on a side opposite to the second connecting portion. The land-connected portion is connected to the second connecting portion on a side opposite to the first connecting portion.

According to the above feature, since the fuse terminal has the second connecting portion, it is possible to more effectively prevent the re-connection of the fuse terminal, when compared with a structure in which the fuse terminal has only the first connecting portion in the intermediate portion, in a condition that an actual length of the cut-off portion in a terminal extending direction of the cut-off portion is the same to each other in both cases.

According to a further feature of the present disclosure, the first connecting portion extends from the electrode-connected portion in a direction opposite to the main body, while the land-connected portion is bent with respect to the second connecting portion and extends from the second connecting portion in a direction opposite to the first connecting portion.

According to such a feature, it is possible not only to make the size of the electronic part smaller but also to more stably support the electronic part by the terminals. In addition, since the land-connected portion extends from the second connecting portion in the direction opposite to the first connecting portion, it is possible to more effectively prevent the re-connection of the fuse terminal, when compared with a structure in which the land-connected portion extends in a direction to the first connecting portion.

According to a still further feature of the present disclosure, the first connecting portion is formed on the same plane to that of the electrode-connected portion and extends from the electrode-connected portion in a direction along the board surface.

According to the above feature, the first connecting portion does not extend from the electrode-connected portion in the direction opposite to the main body, but the first connecting portion extends on the same plane to that of the electrode-connected portion and from the electrode-connected portion in the direction parallel to the board surface. It is, therefore, possible to more effectively prevent the re-connection of the fuse terminal.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
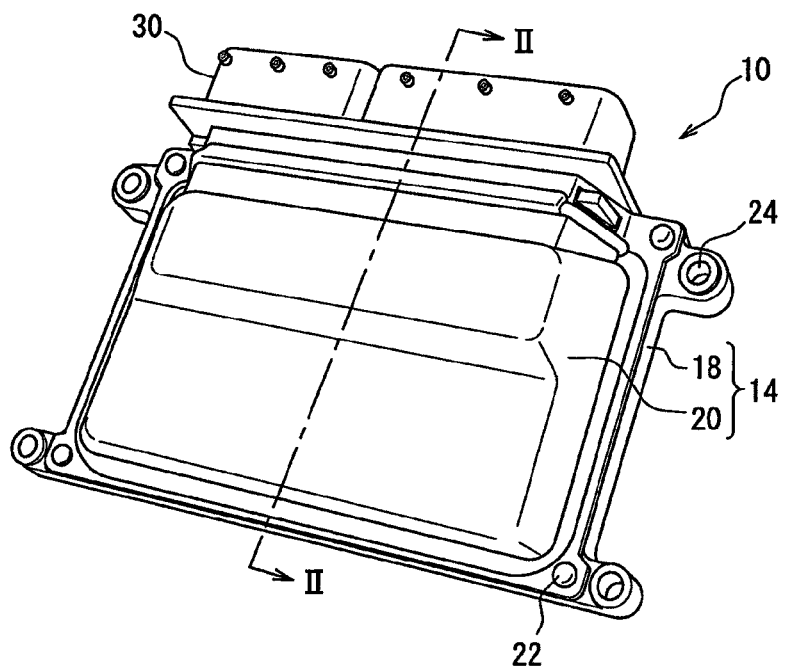
FIG. 1 is a perspective view schematically showing a structure of an electronic control unit according to a first embodiment of the present disclosure.

The present disclosure will be explained hereinafter byway of multiple embodiments. The same reference numerals are given to the same or similar portions and/or structures throughout the embodiments, for the purpose of eliminating repeated explanation.

(First Embodiment)

Figure 2:
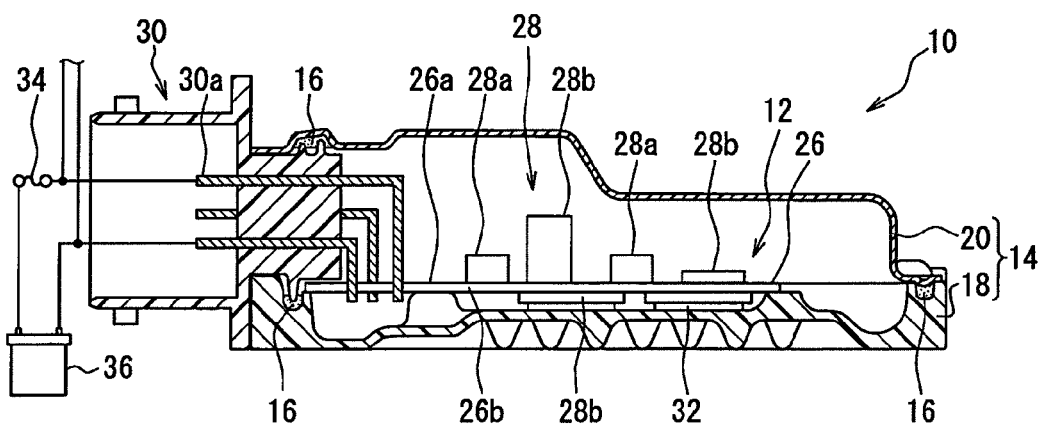
FIG. 2 is a schematic cross sectional view taken along a line II-II in FIG. 1.

An electronic control unit 10 shown in FIGS. 1 and 2 has a circuit board 12 as a main part thereof. The electronic control unit 10 further has a housing 14 for accommodating the circuit board 12 and a seal element 16. In the present embodiment, the electronic control unit 10 is formed as an electronic control unit (ECU) of a water-proof type for controlling an operation of an engine for a vehicle.

An outline structure for the electronic control unit 10 will be hereinafter explained.

The housing 14 is made of metal, such as, aluminum, iron or the like, or resin material, for accommodating therein the circuit board 12 so as to protect the same from water, dust and so on. A number of parts for forming the housing 14 is not limited to a specific number, so that the housing 14 may be composed of one or multiple members.

As shown in FIG. 2, according to the present embodiment, the housing 14 is composed of two parts, that is, a lower casing 18 of a shallow-box shape having an upper open end and an upper casing 20 for closing the upper open end of the lower casing 18. The upper casing 20 is fixed to the lower casing 18 by multiple screws 22 (or bolts) to form an inside space of the housing 14 for accommodating the circuit board 12. In an assembled condition of the housing 14, a portion (or multiple portions) of the circuit board 12 is directly or indirectly interposed between the lower and the upper casings 18 and 20, so that the circuit board 12 is firmly held at a predetermined position inside of the housing 14.

In the present embodiment, the housing 14 is divided into the lower and the upper casings 18 and 20 in a vertical direction (a thickness direction of the circuit board 12). However, a dividing direction for the parts (the lower casing 18 and the upper casing 20) of the housing 14 is not limited to the vertical direction.

Multiple through-holes 24 (four in the present embodiment) are formed at each corner of the lower casing 18 in order that screws or bolts (not shown) are respectively inserted into the through-holes 24 so as to fix the electronic control unit 10 to a predetermined position, for example, to an engine block. An aperture is formed in the housing 14 so that a portion of a connector 30 outwardly protrudes from the inside of the housing 14.

The seal element 16 has a function for preventing water from coming into the inside space of the housing 14. As shown in FIG. 2, the seal element 16 is arranged at a position, at which outer peripheries of the lower and the upper casings 18 and 20 are opposed to each other. The seal element 16 is also arranged at a position, at which the housing 14 and the connector 30 are opposed to each other.

The circuit board 12 is composed of a printed board 26, to which multiple electric or electronic parts and/or components 28 (hereinafter collectively referred to as the electronic parts 28), such as a micro-computer, power transistors, resistors, capacitors and the like are mounted to form electric circuits. The electronic parts 28 are mounted to at least one of board surfaces (a front-side board surface 26a and a back-side board surface 26b) of the printed board 26. In the present embodiment, as shown in FIG. 2, the electronic parts 28 are mounted to both of the board surfaces 26a and 26b of the printed board 26.

For example, multiple electronic parts 28a are mounted to the front-side board surface 26a of the printed board 26, wherein each of the electronic parts 28a has a fuse terminal 48a (FIGS. 4A to 4C), as explained below. The electronic parts 28a correspond to those electronic parts requiring the pattern fuses in a conventional device. The electronic parts other than the electronic parts 28a (having the fuse terminal 48a) are designated by 28b (having no fuse terminal) in the drawing, for the sake of convenience.

In addition to the electronic parts 28, the connector 30 is further mounted to the printed board 26 for electrically connecting the electric circuits formed in the circuit board 12 to outside devices (not shown). In FIG. 2, multiple pins 30a of the connector 30 are mounted to the printed board 26 by a through-hole mounting process. However, the pins 30a may be alternatively mounted to the printed board 26 by a surface-mounting process or a surface-mounting structure.

A reference numeral 32 in FIG. 2 designates heat radiation gel arranged between some of the electronic parts 28b and the lower casing 18 and being in contact with them, so as to transfer heat of the electronic parts 28b to the lower casing 18.

In the above-explained electronic control unit 10, an outside connector (not shown) is fitted to the connector 30 (the pins 30a of the connector 30), so that the electronic control unit 10 is electrically connected to a wire harness (not shown). The connector 30 is electrically connected to a battery 36 (a direct current power source) via a main fuse 34 for protecting the electronic control unit 10 from excess current. The battery 36 is also connected to other electronic control units (not shown), such as a brake control ECU, a steering control ECU, a body ECU, a navigation device and so on.

Since the main fuse 34 is provided in a path for supplying electric power necessary for operating the various kinds of the electronic devices, including the electronic control unit 10, a large-size fuse (for example, a fuse element for 15A, 20A or the like) is used for the main fuse 34. The main fuse 34 is melted down by the excess current larger than a predetermined value, when any defect or trouble occurs in any one of the electronic devices (including the electronic control unit 10) and thereby the excess current flows through the main fuse 34. Then, the power supply via the main fuse 34 is cut off to prevent an adverse effect to the other electronic devices.

Figure 3:
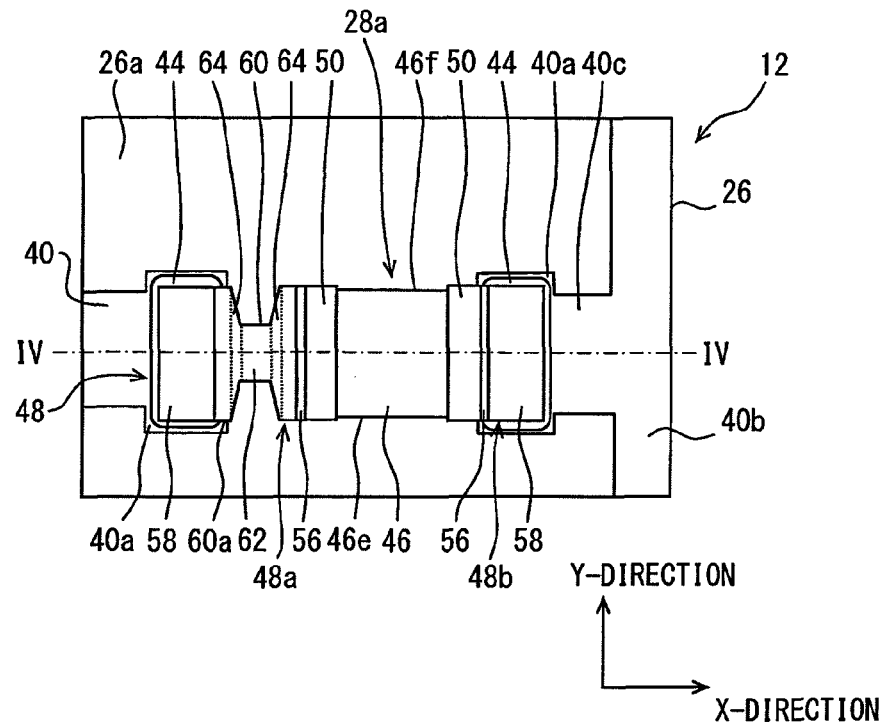
FIG. 3 is a schematically enlarged top plan view showing a portion of a printed board (an electronic part mounted to the printed board)
Figure 4A:
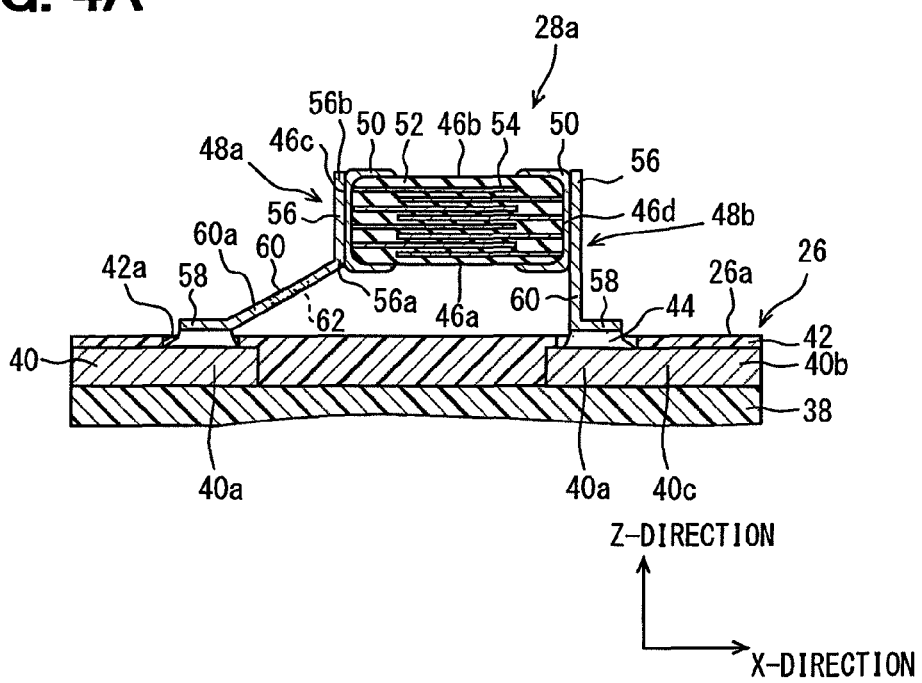
FIG. 4A is a schematic cross sectional view taken along a line IV-IV in FIG. 3.

The circuit board 12, in particular, the electronic part 28a, will be explained more in detail with reference to FIGS. 3 and 4A to 4C. FIGS. 3 and 4A show relevant portions of the circuit board 12, including one of the electronic parts 28a and portions of the circuit board 12 neighboring to the electronic part 28a mounted to the printed board 26. In FIG. 3, a resist 42 (shown in FIG. 4A) is eliminated for the sake of convenience.

Hereinafter, one of directions parallel to the board surface 26a of the printed board 26 is referred to as an X-direction, while a direction parallel to the board surface 26a but perpendicular to the X-direction is referred to a Y-direction. A direction perpendicular to the board surface 26a (the thickness direction of the printed board 26) is referred to as a Z-direction (equal to the vertical direction).

The printed board 26 is composed of an insulating board 38 made of resin or ceramics as its main material, and wiring patterns 40 made of conducting material (such as cupper) and arranged on the insulating board 38. Although not shown in the drawing, in the present embodiment, the wiring patterns 40 are formed in a multi-layer structure on the insulating board 38 and the wiring patterns 40 are formed at both board surfaces of the insulating board 38.

The resist 42 is arranged on the board surface of the insulating board 38 (corresponding to the front-side board surface 26a of the printed board 26) so as to cover the wiring patterns 40. The resist 42 has openings 42a at predetermined positions. A portion of the wiring patterns 40, which is exposed to an outside of the printed board 26 via each of the openings 42a, forms a land 40a connected to the electronic part 28a via solder 44.

A resist (42: not shown) is also arranged on the board surface of the insulating board 38 corresponding to the back-side board surface 26b of the printed board 26, so that lands (40a: not shown) are exposed to the outside through respective openings (42a: not shown).

As shown in FIGS. 3 and 4A, the electronic part 28a has an electronic-element main body 46 and multiple terminals 48. The electronic-element main body 46 (hereinafter, the main body 46) has at least one electronic element (a capacitor as explained below) and has multiple electrodes 50 electrically connected to the electronic element and arranged at outer surfaces of the main body 46. The main body 46 is arranged above the front-side board surface 26a of the printed board 26. In the present embodiment, the circuit board 12 has multiple electronic parts 28a and at least one of the electronic parts 28a is composed of a ceramic-type laminated capacitor. As shown in FIG. 4A, the main body 46 of the electronic part 28a (the ceramic-type laminated capacitor) has dielectric layers 52 made of high-dielectric ceramics of a barium-titanate type and electric conductor layers 54, wherein the dielectric layers 52 and the electric conductor layers 54 are alternately laminated. The electrodes 50 are connected to the electric conductor layers 54.

As shown in FIG. 3, an outer shape of the main body 46 of the electronic part 28a is formed in a rectangular shape on a plane defined by the X-direction and the Y-direction, which is in parallel to the front-side board surface 26a of the printed board 26. The main body 46 has the electrodes 50 at its both longitudinal ends in the X-direction. More exactly, one of the electrodes 50 is formed on a part of a lower-side surface 46a (FIG. 4A), a part of an upper-side surface 46b (FIG. 4A), a first side surface 46c (a left-hand side surface in FIG. 4A), a part of a third side surface 46e (FIG. 3) and a part of a fourth side surface 46f (FIG. 3). The other of the electrodes 50 is formed on another part of the lower-side surface 46a, another part of the upper-side surface 46b, a second side surface 46d (a right-hand side surface in FIG. 4A), another part of the third side surface 46e and another part of the fourth side surface 46f. Each of the terminals 48 is connected to the respective electrode 50 by solder (not shown). The solder for connecting the electrode 50 to the terminal 48 has a higher melting point than the solder 44 for connecting the terminal 48 to the land 40a, so that the solder at the electrode 50 is not melted down in a reflow soldering process.

Each of the terminals 48 is connected to the respective electrode 50 and extends from the main body 46 in the vertical direction or in a downward direction toward the printed board 26, so that the multiple terminals 48 support the main body 46 above the front-side board surface 26a (at a position above and separated from the front-side board surface 26a) in a condition that each of the terminals 48 is electrically and mechanically connected to the respective lands 40a of the printed board 26. Each of the terminals 48 is made of a metal plate having a constant thickness by punching out the metal plate in a predetermined two-dimensional shape and bending the punched-out plate to a predetermined three-dimensional shape. Each of the terminals 48 has an electrode-connected portion 56 electrically and mechanically connected to the electrode 50 by the solder, a land-connected portion 58 electrically and mechanically connected to the land 40a by the solder 44, and an intermediate portion 60 for connecting the electrode-connected portion 56 and the land-connected portion 58 with each other.

One of the terminals 48 is composed of the fuse terminal 48a having a cut-off portion 62. In the present embodiment, one fuse terminal 48a is connected to one electrode 50. Two terminals 48 are connected to the electronic part 28a, wherein one of them is the fuse terminal 48a, while the other terminal 48 is composed of a normal terminal 48b having no cut-off portion. As above, only one fuse terminal 48a is connected to one of the electrodes 50, while only one normal terminal 48b is connected to the other of the electrodes 50.

As shown in FIGS. 3 and 4A to 4C, the fuse terminal 48a has a first connecting portion 60a (at least as a part of the intermediate portion 60 for the fuse terminal 48a) extending almost along the plane defined by the X-direction and the Y-direction. More exactly, the first connecting portion 60a extends in a direction inclined with respect to the board surface 26a of the printed board 26 by an angle smaller than 90 degrees. The cut-off portion 62 is formed as apart of the first connecting portion 60a. The cut-off portion 62 is located at the position above and separated from the board surface 26a of the printed board 26 in the condition that the fuse terminal 48a is connected to the land 40a. In the present embodiment, the first connecting portion 60a is substantially equal to the intermediate portion 60.

The cut-off portion 62 has a width smaller than that of other portions of the fuse terminal 48a, so that the cut-off portion 62 is melted down by heat generation due to excess current in order to cut off the excess current. The width of the cut-off portion 62 corresponds to a dimension of the cut-off portion 62 in the Y-direction, which is perpendicular to a current flow direction in the fuse terminal 48a and perpendicular to a thickness direction of the fuse terminal 48a. Since the fuse terminal 48a is made of the metal plate having the constant thickness by punching out the same in the predetermined two-dimensional shape and then bending it to the predetermined three-dimensional shape, a cross sectional area of the cut-off portion 62 in a cross section perpendicular to the current flow direction is made to be smaller than that of the other portions of the fuse terminal 48a.

In the present embodiment, the fuse terminal 48a is connected to only the electrode 50 formed on the first side surface 46c (which is one of the longitudinal ends of the main body 46 in the X-direction). More exactly, the electrode-connected portion 56 of the fuse terminal 48a has a rectangular shape corresponding to that of the first side surface 46c and connected to the whole area of the first side surface 46c. Accordingly, a thickness direction of the electrode-connected portion 56 of the fuse terminal 48a corresponds to the longitudinal direction of the main body 46, that is, the X-direction. The electrode-connected portion 56 has a lower end 56a and an upper end 56b in the Z-direction. The lower end 56a of the electrode-connected portion 56 closer to the board surface 26a is connected to one end of the intermediate portion 60 (the first connecting portion 60a).

The other end of the intermediate portion 60 of the fuse terminal 48a is connected to the land-connected portion 58. A thickness direction of the land-connected portion 58 corresponds to the Z-direction. The land-connected portion 58 is formed in an almost rectangular shape (in the plane defined by the X-direction and the Y-direction) corresponding to the shape of the land 40a.

Figure 4B:
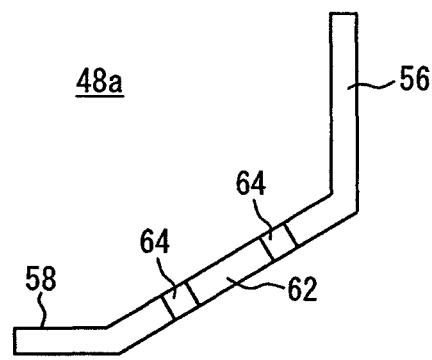
FIG. 4B is a schematically enlarged side view showing a fuse terminal shown in FIG. 4A.
Figure 4C:
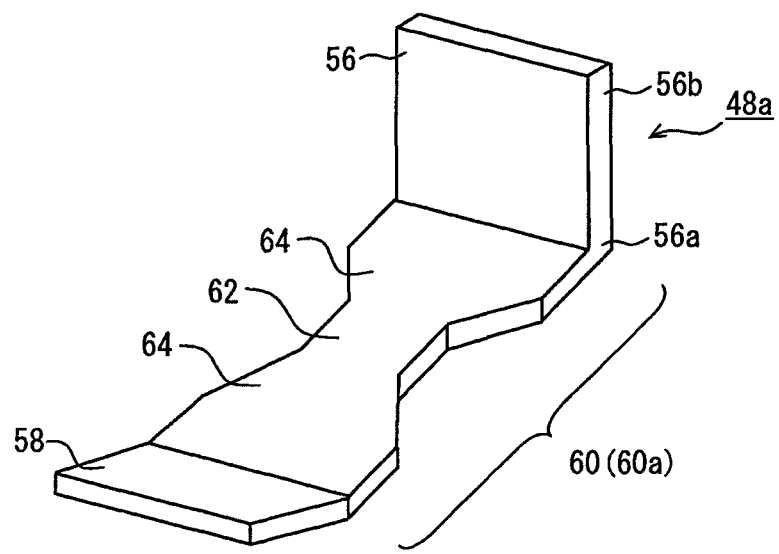
FIG. 4C is an enlarged perspective view showing the fuse terminal shown in FIG. 4A.

As shown in FIGS. 4A to 4C, the intermediate portion 60 is bent by a predetermined acute angle with respect to the electrode-connected portion 56 and extends from the electrode-connected portion 56 in a direction toward the printed portion 26 and in a direction opposite to the main body 46. The land-connected portion 58 is further bent by a predetermined acute angle with respect to the intermediate portion 60 and the electrode-connected portion 56. The land-connected portion 58 extends from the intermediate portion 60 in a direction opposite to the electrode-connected portion 56. In the present embodiment, the intermediate portion 60 is inclined with respect to the board surface 26a in the Z-direction, so that a distance in the Z-direction between a point of the intermediate portion 60 and the lower end 56a of the electrode-connected portion 56 is increased as the point of the intermediate portion 60 is more separated from the lower end 56a in the direction to the land-connected portion 58. In the present embodiment, the fuse terminal 48a has one intermediate portion 60, which is formed by the first connecting portion 60a extending almost along the board surface 26a of the printed board 26.

The cut-off portion 62 is formed at least as a part of the first connecting portion 60a, as shown in FIGS. 3, 4A, 4B and 4C. In FIGS. 4B and 4C, the cut-off portion 62 is more clearly indicated. The cut-off portion 62 is formed at a center of the first connecting portion 60a in the direction extending from the land-connected portion 58 to the electrode-connected portion 56 (hereinafter, a terminal extending direction). As a result, the cut-off portion 62 is formed at a position separated from the land-connected portion 58 by a predetermined distance in the Z-direction. According to the above structure, the solder 44 is not adhered to the cut-off portion 62 even after the reflow soldering process. As shown in FIG. 3 and FIG. 4C, tapered portions 64 are formed at both longitudinal sides of the cut-off portion 62 in the terminal extending direction. In each of the tapered portions 64, a width is decreased in a direction to the cut-off portion 62. In the present embodiment, a width of the fuse terminal 48a is constant except for the cut-off portion 62 and the tapered portions 64.

In a similar manner to the fuse terminal 48a, the normal terminal 48b is made of a metal plate having a constant thickness by punching out the same in a predetermined two-dimensional shape (a rectangular shape) and then bending it at one portion to a predetermined three-dimensional shape. In other words, the normal terminal 48b is formed in an L-letter shape in a cross section of a plane defined by the X-direction and the Z-direction, as shown in FIG. 4A. The normal terminal 48b has no cut-off portion.

In the present embodiment, the normal terminal 48b has the same thickness to that of the fuse terminal 48a. In addition, a width of the normal terminal 48b, that is, a dimension in the Y-direction perpendicular to the current flow direction and perpendicular to the thickness direction of the normal terminal 48b, is equal to the width of the fuse terminal 48a (except for the cut-off portion 62 and the tapered portions 64).

In the present embodiment, the normal terminal 48b is connected to only the electrode 50 formed on the second side surface 46d (which is the other of the longitudinal ends of the main body 46 in the X-direction). More exactly, the electrode-connected portion 56 of the normal terminal 48b has a rectangular shape corresponding to that of the second side surface 46d and connected to the whole area of the second side surface 46d. Accordingly, a thickness direction of the electrode-connected portion 56 of the normal terminal 48b corresponds to the longitudinal direction of the main body 46, that is, the X-direction. Although not shown in the drawing, the electrode-connected portion 56 of the normal terminal 48b likewise has a lower end (56a) and an upper end (56b) in the Z-direction. The lower end (56a) of the electrode-connected portion 56 of the normal terminal 48b is connected to one end of the intermediate portion 60 of the normal terminal 48b.

The intermediate portion 60 of the normal terminal 48b extends in the same plane to that of the electrode-connected portion 56 and in the Z-direction toward the board surface 26a. Then, the other end of the intermediate portion 60 is connected to the land-connected portion 58 of the normal terminal 48b. A thickness direction of the land-connected portion 58 of the normal terminal 48b corresponds to the Z-direction. The land-connected portion 58 is likewise formed in an almost rectangular shape (on the plane defined by the X-direction and the Y-direction) corresponding to the shape of the land 40a. The land-connected portion 58 of the normal terminal 48b is bent by almost 90 degrees with respect to the electrode-connected portion 56 and extends from the intermediate portion 60 in a direction opposite to the electrode-connected portion 56 (away from the main body 46).

As shown in FIG. 3, the fuse terminal 48a of the electronic part 28a is electrically connected to a power-source wiring pattern 40b via the land 40a and a connecting wiring pattern 40c. The power-source wiring pattern 40b corresponds to a part of the wiring patterns 40, which is commonly used for multiple electronic parts 28 (including the electronic part 28a). The power-source wiring pattern 40b is electrically connected to the battery 36 via the pin 30a of the connector 30.

Advantages of the electronic part 28a and the electronic control unit 10 of the present embodiment will be explained.

In the present embodiment, the electrodes 50 of the electronic part 28a are not directly connected to the lands 40a of the printed board 26 via the solders 44. Instead, the multiple terminals 48 are provided between the electrodes 50 and the lands 40a so that the electrodes 50 are indirectly connected to the lands 40a via the respective terminals 48. In addition, one of the terminals 48 for the electronic part 28a is composed of the fuse terminal 48a having the cut-off portion 62. Accordingly, when short-circuit occurs in the electronic part 28a and thereby the excess current (short-circuit current) flows, the heat is generated depending on the excess current at the cut-off portion 62 having the smaller width. And when temperature at the cut-off portion 62 becomes higher than a predetermined value, the cut-off portion 62 is melted down and the electrical connection between the electrode 50 and the land 40a is cut off. Accordingly, it is possible to quickly cut off the electrical connection between the electrode 50 and the land 40a (which are connected to each other by the fuse terminal 48a before the melt-down) when the excess current flows through the fuse terminal 48a.

As above, the function for cutting off the excess current (the short-circuit current) caused by a short-circuit fault of the electronic part 28a is realized not by a pattern fuse formed in the printed board 26 but by the fuse terminal 48a for the electronic part 28a. As a result, it becomes possible to commonalize and/or standardize the printed boards 26, which can be commonly used for the different types of the electronic control units. Therefore, it is possible to provide variation products, for which the same printed boards 26 can be used but different electronic parts 28a are mounted to the printed board 26.

In addition, it is possible to make the size of the printed board 26 as well as the electronic control unit 10 smaller by such a volume corresponding to the pattern fuse, which is not necessary in the present embodiment.

In addition, the fuse terminal 48a has the first connecting portion 60a, which is the part of the intermediate portion 60 for connecting the electrode-connected portion 56 to the land-connected portion 58. The cut-off portion 62 is formed in the first connecting portion 60a. In other words, the cut-off portion 62 is not in contact with the board surface 26a of the printed board 26 but supported at the position above the board surface 26a (that is, at the position above and separated from the board surface 26a). As a result, it is possible to avoid a situation that melted-down metal (melted-down solder) spreads over the board surface 26a and thereby the melted-down portions of the cut-off portion 62 are connected again.

Figure 5:
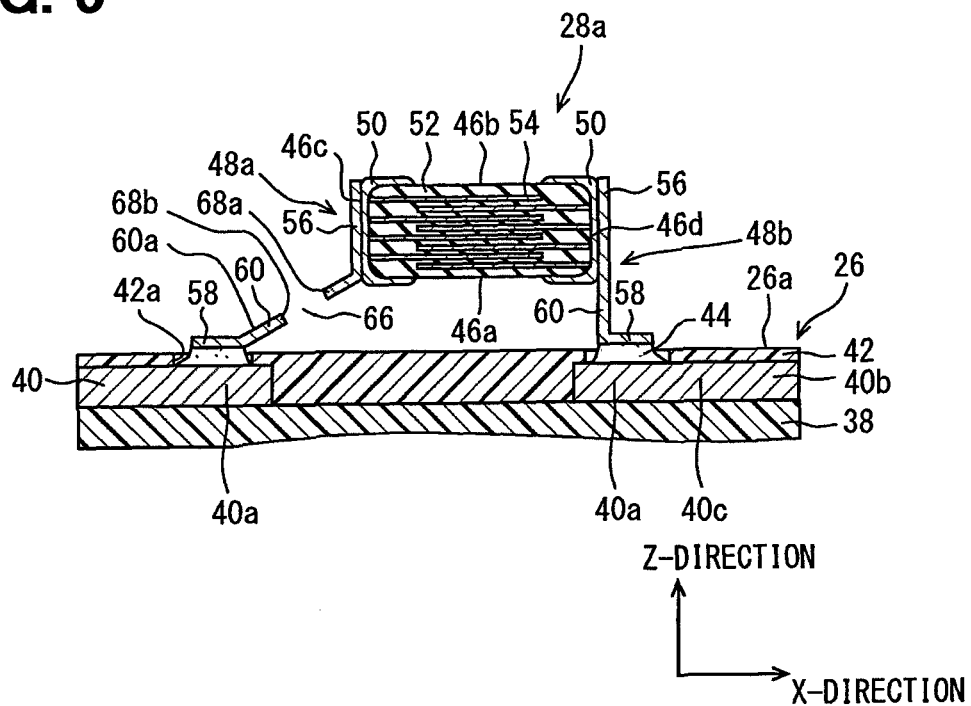
FIG. 5 is a schematic cross sectional view showing an electronic part corresponding to FIG. 4A, wherein a cut-off portion of the fuse terminal is melted down.

As shown in FIG. 5, when the cut-off portion 62 is melted down, a gap 66 is formed at a position at which the cut-off portion 62 existed. A first cut-off end 68a (on a side to the electrode-connected portion 56) and a second cut-off end 68b (on a side to the land-connected portion 58) are respectively formed in the intermediate portion 60 after the cut-off portion 62 is melted down.

In a hypothetical structure in which a cut-off portion (62) is formed in an intermediate portion (60) extending in the vertical direction (in the Z-direction), when the cut-off portion (62) is melted down a gap (66) is likewise formed at a position at which the cut-off portion (62) existed. And a first cut-off end (68a) is located at a position just above a second cut-off end (68b) in the vertical direction. The first and second cut-off ends (68a, 68b) correspond to both ends of the gap (66) formed at the cut-off portion (62) and the first and second cut-off ends (68a, 68b) are opposed to each other over the gap (66) in the vertical direction, when the cut-off portion (62) of a fuse terminal (48a) is melted down. When vibration is applied to an electronic part (28a) from outside, for example, due to vehicle vibration, and a main body (46) is thereby vibrated in the vertical direction, the first and second cut-off ends (68a, 68b) may be possibly connected again to each other. Furthermore, when a normal terminal (48b) is bent by weight of the main body (46) and/or vibration from the outside applied to the main body (46), the main body (46) and the first cut-off end (68a) may be moved in the vertical direction and the fuse terminal (48a) may be possibly re-connected.

According to the present embodiment, however, the fuse terminal 48a has the first connecting portion 60a (at least as the part of the intermediate portion 60), which extends almost in the X-direction from the electrode-connected portion 56

(or from the land-connected portion 58) to the other, and the cut-off portion 62 is formed in the first connecting portion 60*a*. More exactly, the first connecting portion 60*a* extends in the X-direction and is inclined with respect to the board surface 26*a* in the Z-direction by the predetermined angle smaller than 90 degrees. The cut-off portion 62, which has a predetermined length in the terminal extending direction, is formed in the first connecting portion 60*a*. Therefore, as shown in FIG. 5, the first cut-off end 68*a* and the second cut-off end 68*b* do not overlap in the X-direction and the Z-direction, in the condition that the cut-off portion 62 is melted down. Namely, the gap 66 is formed between the first and second cut-off ends 68*a* and 68*b* in the X-direction and in the Z-direction. When compared with the above explained hypothetical structure, in which the cut-off portion (62) is formed in the intermediate portion (60) extending in the vertical direction (in the Z-direction), the present embodiment is more advantageous in that the re-connection of the melted-down portion of the fuse terminal 48*a* can be more effectively prevented.

In addition, the cut-off portion 62 is held at the position above and separated from the board surface 26*a* of the printed board 26, in the condition that the fuse terminal 48*a* is connected to the land 40*a*. Therefore, the heat at the cut-off portion 62 does not directly go away to the printed board 26. It is possible to shorten a time period between occurrence of the short-circuit and the melt-down of the cut-off portion 62. Response for cutting off the excess current can be thus improved.

In a case that the response is improved by the pattern fuse, it is necessary to make the pattern fuse thinner than other portions of the wiring patterns or to make the pattern fuse with such material which is more easily melted down than the other portions of the wiring patterns. However, the above method increases manufacturing cost.

According to the present embodiment, since the heat of the cut-off portion 62 is not easily transferred to the printed board 26, it is possible not only to improve the response but also to reduce the manufacturing cost. Furthermore, since the heat of the cut-off portion 62 is not easily transferred to the printed board 26, it is possible to loosen up designing of heat-resisting performance for the printed board 26. The manufacturing cost is correspondingly further reduced.

In the printed board having the pattern fuses, heat generated at electronic parts neighboring to one pattern fuse and/or heat generated at other pattern fuses adjacent to the one pattern fuse is transferred to the one pattern fuse via the insulating board and the wiring patterns. Since the pattern fuse is influenced by the heat generated at portions surrounding the pattern fuse, the pattern fuse may be melted down before the short-circuit fault occurs in the electronic part, in a case of a high-density packaging.

According to the present embodiment, however, since the cut-off portion 62 is held at the position above and separated from the board surface of the printed board 26, the cut-off portion 62 is not easily influenced by the heat of the other electronic parts 28. It is, therefore, possible to realize the high-density packaging. In other words, the size of the printed board 26 can be reduced and thereby the manufacturing cost can be correspondingly reduced.

In the electronic control unit 10, at least some of the multiple electronic parts 28*a* having the fuse terminals 48*a* are connected to the power-source wiring pattern 40*b* via the lands 40*a* and the connecting wiring patterns 40*c*. As already explained above, when the short-circuit fault occurs in one of the electronic parts 28*a* and the excess current flows in the fuse terminal 48*a*, the connection between the electrode 50 and the land 40*a* is immediately cut off by the melt-down of the cut-off portion 62 of the fuse terminal 48*a* (which has connected the electrode 50 and the land 40*a* before the melt-down). Accordingly, it is possible to protect the other electronic parts 28 connected to the power-source wiring pattern 40*b* from the excess current.

The excess current flowing in the fuse terminal 48*a* for cutting off the cut-off portion 62 is not so large as the excess current for cutting off the main fuse 34. Therefore, it is possible to suppress adverse influence, which may be caused by the excess current flowing in the fuse terminal 48*a*, to power-supply to the other electronic devices.

In the present embodiment, the electronic part 28*a* includes the ceramic-type laminated capacitor. In a case that the electronic part 28*a* of the laminated structure is used, the size of the electronic part 28*a* can be made smaller and the high-density packaging for the printed board 26 can be realized. However, on the other hand, the electronic part having the laminated structure may have a problem that the electric conductor layers 54 (which are laminated in multiple layers) are likely to be short-circuited by vehicle vibration and/or heat stress. In the present embodiment having the electronic part 28*a* of the laminated structure, however, it is possible to rapidly cut off the electrical connection between the electrode 50 and the land 40*a*, if the short-circuit fault occurs.

The battery of a lithium system is more advantageous than a lead battery in view of power supplying capability. On the other hand, the lithium battery has such a disadvantage that it will be quickly deteriorated when current larger than a rated output current is supplied to electric loads. According to the present embodiment, however, the electrical connection between the electrode 50 and the land 40*a* is immediately cut off by the fuse terminal 48*a* in the case of short-circuit in the electronic part 28*a*. It is, therefore, possible to suppress adverse influence to the battery to a minimum value.

(Second Embodiment)

Figure 8:
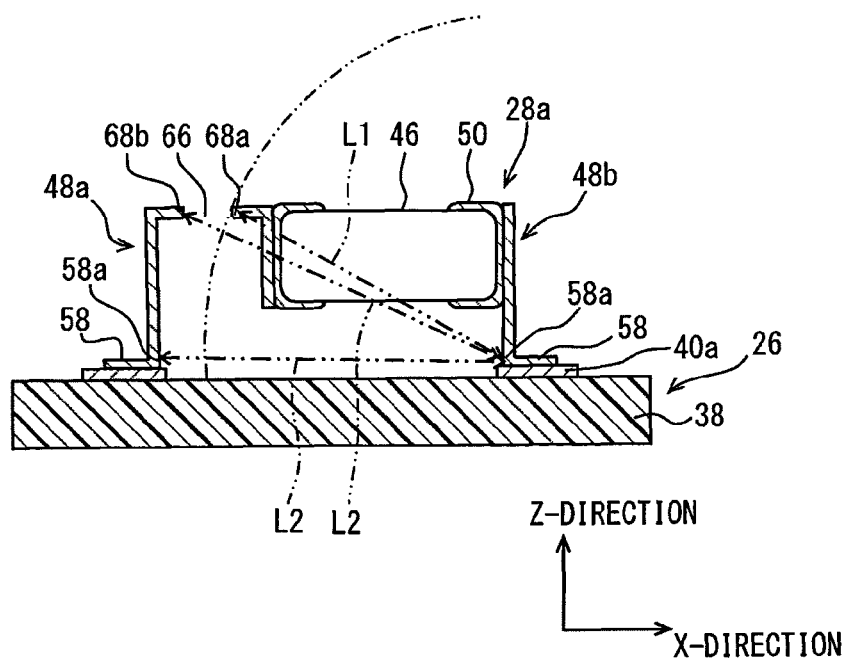
FIG. 8 is a view for explaining an effect of the fuse terminal of the second embodiment of FIG. 6A and FIG. 7.
Figure 9A:
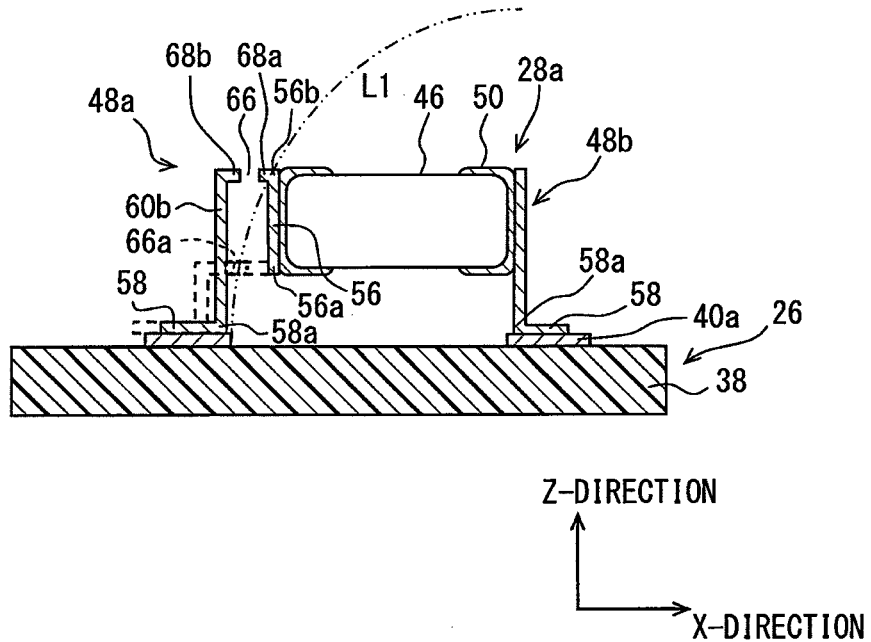
FIG. 9A is a view for explaining another effect of the fuse terminal of the second embodiment.

A second embodiment will be explained with reference to FIGS. 6 (6A, 6B and 6C) to 9 (9A and 9B). Explanation for those portions, which are similar to or the same to those of the first embodiment (including the electronic part 28*a*, the electronic control unit 10 and so on), will be omitted. In FIGS. 8 and 9A, the electronic part 28*a* and the printed board 26 are shown in a simplified manner.

In the present embodiment, the main body 46 also has the rectangular shape on the plane defined by the X-direction and the Y-direction (that is, the plane in parallel to the board surface 26*a*). The fuse terminal 48*a* is connected to the electrode 50 formed on the first side surface 46*c*, while the normal terminal 48*b* is connected to the electrode 50 formed on the second side surface 46*d*. This structure is referred to as a first technical feature of the present embodiment.

The intermediate portion 60 of the fuse terminal 48*a* has a second connecting portion 60*b* in addition to the first connecting portion 60*a*, wherein the second connecting portion 60*b* extends in the vertical direction (the Z-direction). The first and the second connecting portion 60*a* and 60*b* are connected to each other at an angle of 90 degrees. The electrode-connected portion 56 is connected to the first connecting portion 60*a* on a side opposite to the second connecting portion 60*b*, while the land-connected portion 58 is connected to the second connecting portion 60*b* on a side opposite to the first connecting portion 60*a*. This structure is referred to as a second technical feature of the present embodiment.

Figure 7:
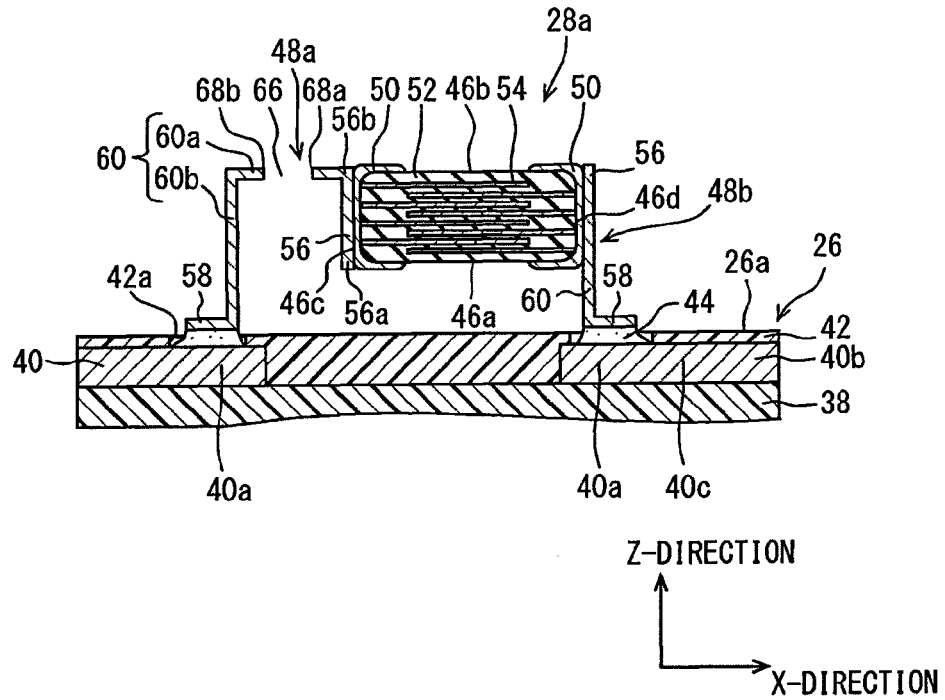
FIG. 7 is a schematic cross sectional view showing an electronic part corresponding to FIG. 6A, wherein a cut-off portion of the fuse terminal is melted down.

According to the present embodiment, since the fuse terminal 48*a* has the second connecting portion 60*b* extending in the Z-direction, so that the first connecting portion 60*a* extends in the X-direction, that is, the direction parallel to the board surface 26a. The present embodiment is compared with the first embodiment (which has only the first connecting portion 60a in the intermediate portion 60), in the condition that an actual length of the first connecting portion 60a in the terminal extending direction of the fuse terminal 48a is the same to each other. Then, a projected length of the first connecting portion 60a of the second embodiment, which is projected on the plane defined by the X-direction and the Y-direction (that is, the plane parallel to the board surface 26a), is larger than that of the first connecting portion 60a of the first embodiment. Accordingly, as shown in FIG. 7, the distance of the gap 66 in the X-direction (that is equal to the projected length) between the first cut-off end 68a on the side to the electrode-connected portion 56 and the second cut-off end 68b on the side to the land-connected portion 58 is larger than the projected length of the gap 66 in the X-direction of the first embodiment projected on the plane parallel to the board surface 26a. As a result, the possible re-connection of the fuse terminal 48a can be more effectively prevented.

In addition, the first connecting portion 60a is bent by an angle of 90 degrees with respect to the electrode-connected portion 56 and extends from the electrode-connected portion 56 in the X-direction away from the main body 46. The second connecting portion 60b is bent by an angle of 90 degrees with respect to the first connecting portion 60a and extends from the first connecting portion 60a in the Z-direction (in the direction parallel to the electrode-connected portion 56), so that the second connecting portion 60b and the electrode-connected portion 56 are opposed to each other in the X-direction. The land-connected portion 58 is bent by an angle of 90 degrees with respect to the second connecting portion 60b and extends in the X-direction away from the first connecting portion 60a (in the direction opposite to the first connecting portion 60a) and the main body 46. This structure is referred to as a third technical feature of the present embodiment.

When compared the present embodiment with such a case in which the first connecting portion 60a is formed on the same plane to that of the electrode-connected portion 56 and extends from the electrode-connected portion 56 in the Y-direction (in the direction parallel to the board surface 26a), the size of the electronic part 28a of the present embodiment can be made smaller and it is possible to more stably support the electronic part 28a by the terminals 48.

In addition, in the present embodiment, the land-connected portion 58 extends from the second connecting portion 60b in the X-direction and in the direction opposite to the first connecting portion 60a. When compared the present embodiment with a case in which the land-connected portion 58 extends in the X-direction but in a direction to the first connecting portion 60a, it is possible in the present embodiment to more surely protect the possible re-connection of the fuse terminal 48a.

Figure 6A:
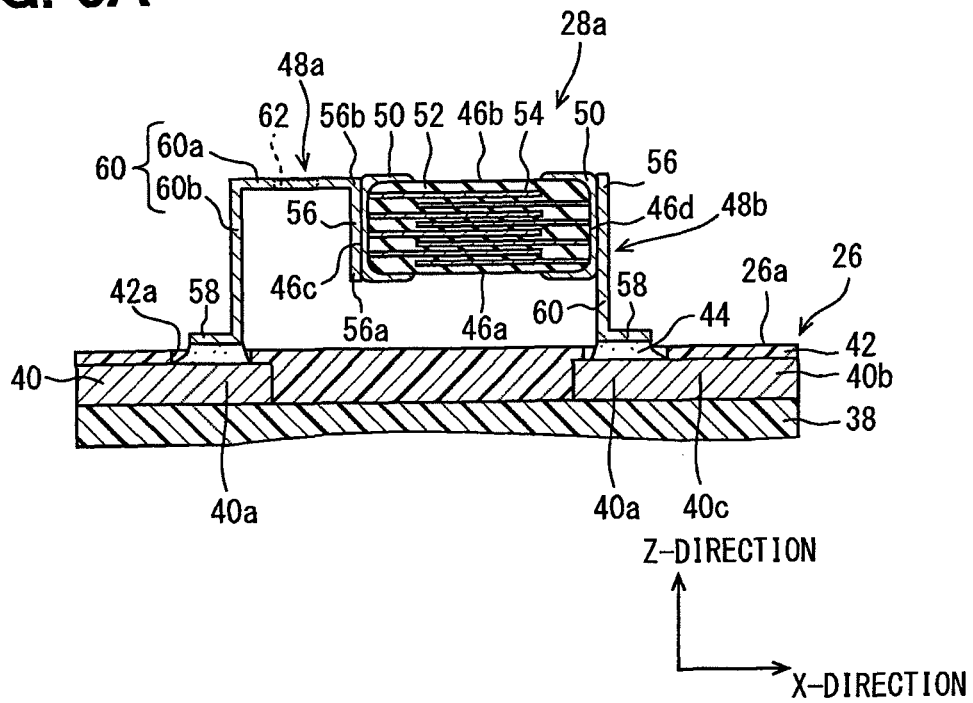
FIG. 6A is a schematic cross sectional view showing a part of a circuit board according to a second embodiment of the present disclosure, wherein FIG. 6A corresponds to FIG. 4A.
Figure 6B:
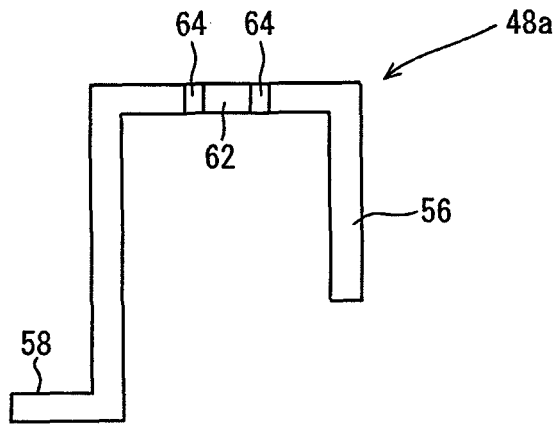
FIG. 6B is a schematically enlarged side view showing a fuse terminal shown in FIG. 6A.
Figure 6C:
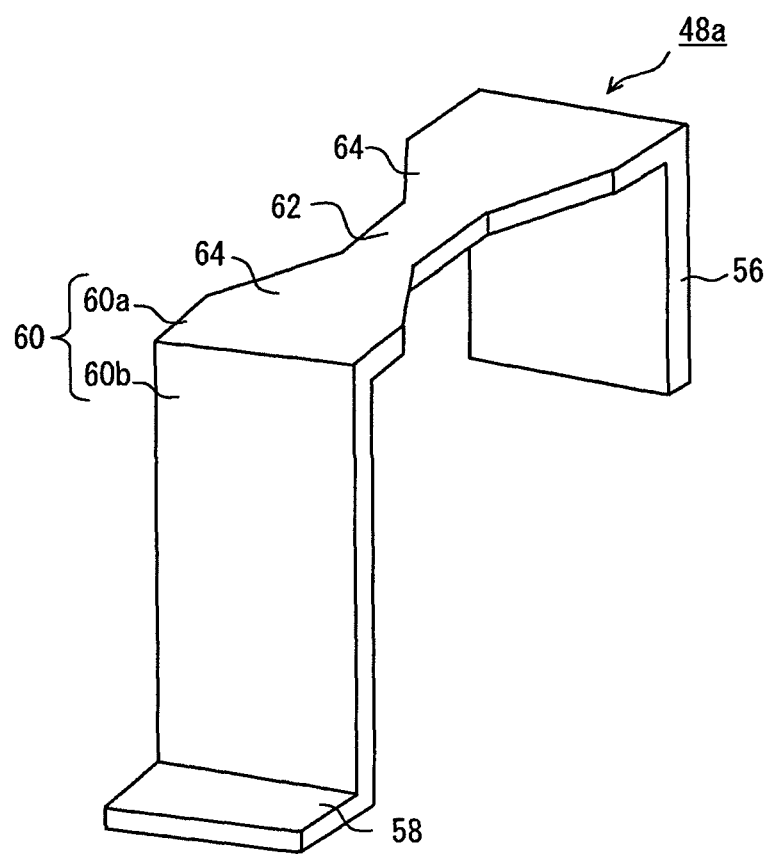
FIG. 6C is an enlarged perspective view showing the fuse terminal shown in FIG. 6A.

In addition, as shown in FIG. 6A, the first connecting portion 60a extends on the plane defined by the X-direction and the Y-direction. In other words, the first connecting portion 60a extends in the direction parallel to the board surface 26a of the printed board 26. This structure is referred to as a fourth technical feature of the present embodiment. It is, therefore, possible to maximize the projected length of the cut-off portion 62 in the terminal extending direction of the first connecting portion 60a, when the cut-off portion 62 is projected on the plane defined by the X-direction and the Y-direction. In other words, when compared the present embodiment with the case in which the actual length of the cut-off portion 62 in the terminal extending direction of the first connecting portion 60a is the same to that of the present embodiment but the first connecting portion 60a is inclined with respect to the board surface 26a (for example, as in the first embodiment), the larger gap 66 can be formed in the present embodiment in the X-direction between the first cut-off end 68a on the side to the electrode-connected portion 56 and the second cut-off end 68b on the side to the land-connected portion 58 when the cut-off portion 62 is melted down. As a result, it is possible to more effectively prevent the re-connection of the fuse terminal 48a.

In FIG. 8, a reference numeral 58a corresponds to an inner-side end of the land-connected portion 58 of each of the terminals 48a and 48b in the X-direction. More exactly, the inner-side end 58a is an end of the land-connected portion 58 closer to the main body 46 in its longitudinal direction (the X-direction), which corresponds to a direction in which the first side surface 46c and the second side surface 46d of the main body 46 are arranged. The inner-side end 58a of the normal terminal 48b is also referred to as a starting point for a possible bending movement of the normal terminal 48b.

As shown in FIG. 8, a distance L1 corresponds to such a distance between the starting point 58a and the first cut-off end 68a of the fuse terminal 48a when the cut-off portion 62 is melted down. The first cut-off end 68a corresponds to such a point of the fuse terminal 48a, which remains on the side to the electrode-connected portion 56 and which is farthest from the starting point 58a (the inner-side end 58a of the normal terminal 48b). Any point of the main body 46 or the fuse terminal 48a remaining on the side to the electrode-connected portion 56, which is farthest from the starting point 58a (that is, the first cut-off end 68a in the present embodiment), is referred to as a long-distance point.

In addition, in FIG. 8, a distance L2 corresponds to such a distance between the inner-side end 58a (the starting point 58a) of the normal terminal 48b and a closest point of the fuse terminal 48a (for example, the second cut-off end 68b, the inner-side end 58a or any other point of the fuse terminal 48a) when the cut-off portion 62 is melted down. The above closest point corresponds to such a point of the fuse terminal 48a, which remains on the side to the land-connected portion 58 and which is closest to the inner-side end 58a (the starting point 58a) of the normal terminal 48b. In the present embodiment, each of the second cut-off end 68b and the inner-side end 58a of the fuse terminal 48a is closest to the inner-side end 58a of the normal terminal 48b (closest to the starting point 58a). Any point of the fuse terminal 48a remaining on the side to the land-connected portion 58, which is closest to the starting point 58a, is referred to as a short-distance point. The fuse terminal 48a satisfies a dimensional relationship of "L2>L1". This structure is referred to as a fifth technical feature of the present embodiment.

According to the structure of the present embodiment (the dimensional relationship of "L2>L1" is satisfied), when the cut-off portion 62 is melted down and the normal terminal 48b is bent at the inner-side end 58a of the normal terminal 48b due to the applied outside force (its own weight, the vehicle vibration or the like), and when the main body 46 is rotated toward the board surface 26a, the first cut-off end 68a of the fuse terminal 48a (that is, the long-distance point) is not brought into contact with the inner-side end 58a of the fuse terminal 48a (that is, the short-distance point). Accordingly, it is possible to more effectively prevent the possible re-connection of the fuse terminal 48a.

Figure 9B:
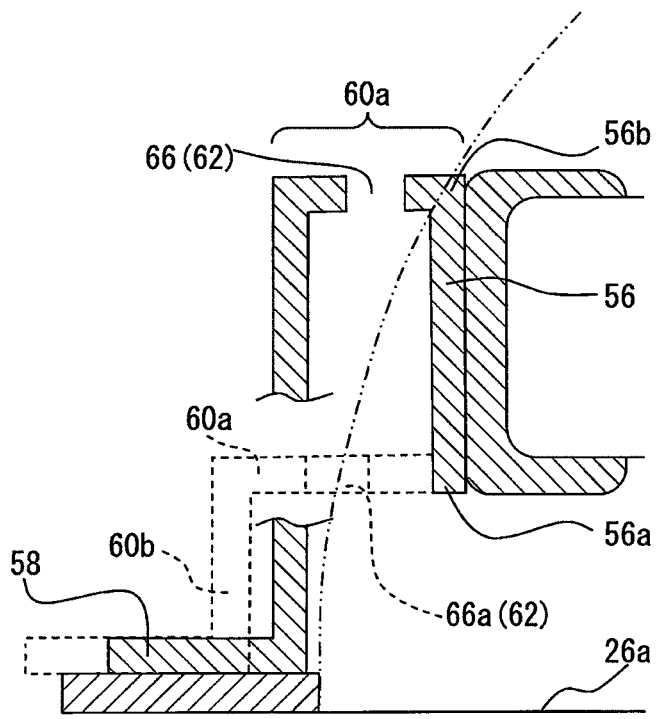
FIG. 9B is a schematically enlarged view showing the fuse terminal of FIG. 9A.

In FIGS. 9A and 9B, a comparison example is indicated by dotted lines. As indicated by the dotted lines, the first connecting portion 60a of the fuse terminal 48a extends in the direction parallel to the surface board 26a and is connected to the lower end 56a of the electrode-connected portion 56. A reference numeral 66a designates a gap, which is formed in the fuse terminal 48a of the comparison example when the cut-off portion 62 is melted down.

In the present embodiment, as shown in FIGS. 9A and 9B, the first connecting portion 60a is connected not to the lower end 56a but to the upper end 56b of the electrode-connected portion 56. This structure is referred to as a sixth technical feature of the present embodiment. Both of the lower and the upper ends 56a and 56b are arranged in the vertical direction (in the Z-direction). The upper end 56b is more remote from the board surface 26a than the lower end 56a.

In the comparison example indicated by the dotted lines in FIGS. 9A and 9B, not the first cut-off end (corresponding to 68a) but the upper end 56b of the electrode-connected portion 56 of the fuse terminal 48a corresponds to the long-distance point, which is farthest from the inner-side end 58a of the normal terminal 48b (the starting point 58a). Therefore, when the main body 46 as well as the part of the fuse terminal 48a remaining on the side of the electrode-connected portion 56 is rotated as a result of the melt-down of the cut-off portion 62, the upper end 56b may be brought into contact with a portion of the fuse terminal 48a on the side to the land-connected portion 58. In order to avoid the above situation, it is necessary to locate the cut-off portion 62 at such a position, which is displaced in the X-direction but away from the main body 46, so that a rotational orbit of the upper end 56b (indicated by a two-dot-chain line in FIGS. 9A and 9B) comes in an area of the gap (66a) formed at the melt-down of the cut-off portion 62. According to the structure of the comparison example, a length of the fuse terminal 48a in the X-direction becomes larger and thereby the size of the electronic part 28a becomes larger.

According to the present embodiment, however, the first cut-off end 68a (the long-distance point) is located at the position close to the upper end 56b of the electrode-connected portion 56, which is farthest from the inner-side end 58a of the normal terminal 48b (the starting point 58a). It is, therefore, possible to make the size of the electronic part 28a smaller.

In the second embodiment, the electronic part 28a is explained as having the above first to sixth technical features. However, it is not always necessary for the electronic part 28a to have all of those technical features. For example, it may be so modified that the electronic part 28a has the second technical feature so that the intermediate portion 60 has the first connecting portion 60a extending in the X-direction and the second connecting portion 60b extending in the Z-direction. It may be further modified so that the electronic part 28a has not all but some of the technical features of the second embodiment, wherein some of the above first to sixth technical features are combined together. For example, a modification may have a combination of the second and the third technical features, another modification may have a combination of the second, the third and the fourth technical features, or a further modification may have a combination of the first technical feature and one of the second to the fourth technical features. Furthermore, a modification may have the first to fifth technical features.

Furthermore, the electronic part 28a of the first embodiment may be so modified that the fuse terminal 48a satisfies the dimensional relationship of "L2>L1". According to such a modification, even when the main body 46 as well as the part of the fuse terminal 48a on the side to the electrode-connected portion 56 is rotated at the starting point 58a (the inner-side end 58a of the normal terminal 48b) due to the melt-down of the cut-off portion 62, any portion of the main body 46 or any part of the fuse terminal 48a on the side to the electrode-connected portion 56 is not brought into contact with any part of the fuse terminal 48a on the side to the land-connected portion 58. Accordingly, it is possible to more effectively prevent the possible re-connection of the fuse terminal 48a.

In the first embodiment, the electronic part 28a may be further modified in such a way that the first connecting portion 60a is connected not to the lower end 56a but to the upper end 56b of the electrode-connected portion 56. According to such modification, the electronic part 28a can be made further smaller.

(Third Embodiment)

A third embodiment will be explained with reference to FIGS. 10 and 11. Explanation for those portions, which are similar to or the same to those of the first and/or the second embodiments (including the electronic part 28a, the electronic control unit 10 and so on), will be omitted.

Figure 10:
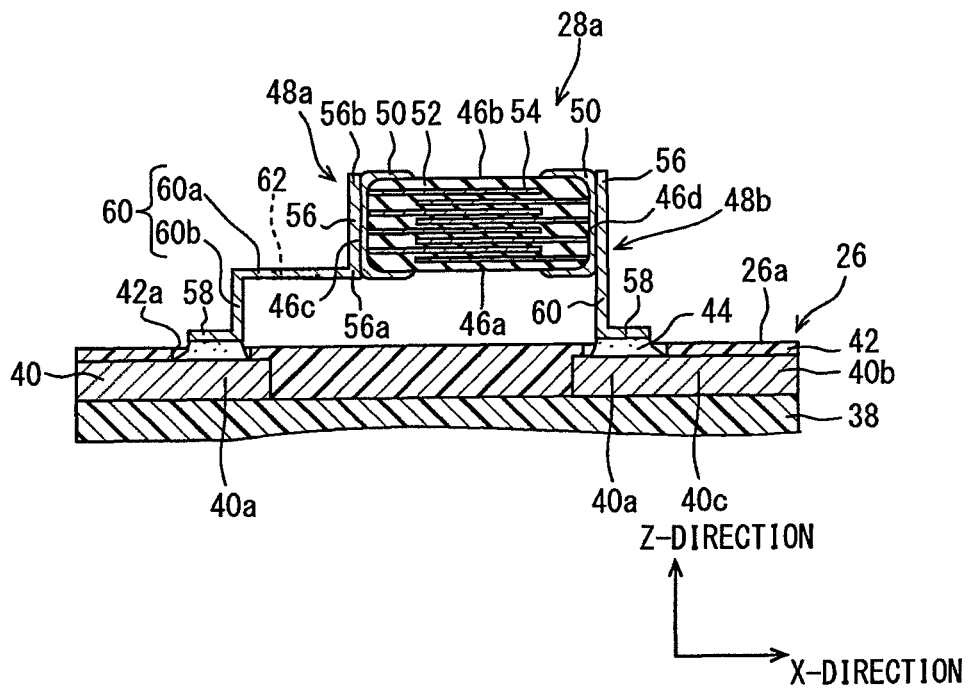
FIG. 10 is a schematic cross sectional view showing a part of a circuit board according to a third embodiment of the present disclosure, wherein FIG. 10 corresponds to FIG. 4A.

As shown in FIG. 10, the first connecting portion 60a is connected to the lower end 56a of the electrode-connected portion 56, wherein the lower end 56a is located at the position closer to the board surface 26a in the Z-direction than the upper end 56b. The other portions of the third embodiment are the same to those of the second embodiment.

Figure 11:
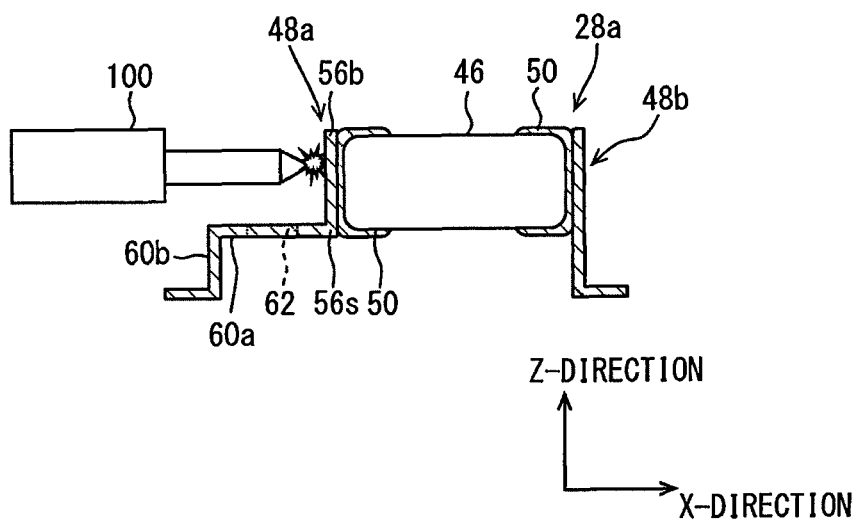
FIG. 11 is a view for explaining an effect of a fuse terminal of the third embodiment of FIG. 10.

According to the present embodiment, as shown in FIG. 11, it is possible to connect the electrode-connected portion 56 of the fuse terminal 48a to the electrode 50 formed on the first side surface 46c of the main body 46 by the solder, in a condition that the electrode-connected portion 56 is placed on the first side surface 46c. The above soldering process is carried out, for example, by a heating tool 100 of a pulse method from the outside of the main body 46 in the X-direction. When compared the present embodiment with a case, in which the first connecting portion 60a is connected to the upper end 56b of the electrode-connected portion 56 (for example, as shown in FIG. 6A), it is easier in the present embodiment to fix the fuse terminal 48a to the main body 46. It is therefore possible to increase productivity of the electronic part 28a.

(Fourth Embodiment)

A fourth embodiment will be explained with reference to FIGS. 12 and 13. Explanation for those portions, which are similar to or the same to those of the first to the third embodiments (including the electronic part 28a, the electronic control unit 10 and so on), will be omitted.

Figure 12:
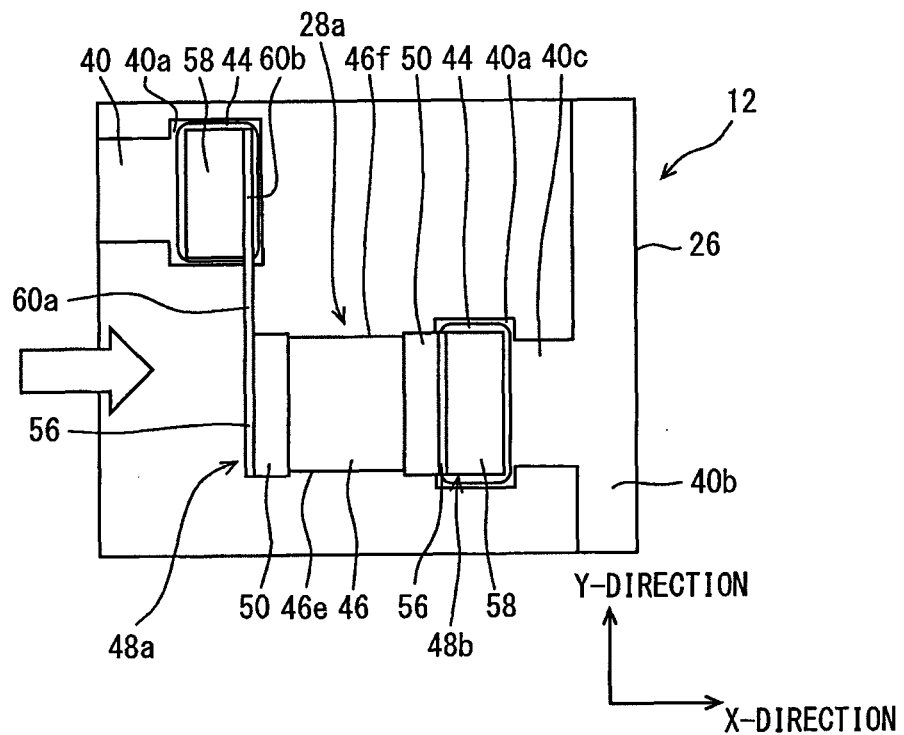
FIG. 12 is a schematically enlarged top plan view showing a portion of a printed board of a fourth embodiment, wherein FIG. 12 corresponds to FIG. 3.
Figure 13:
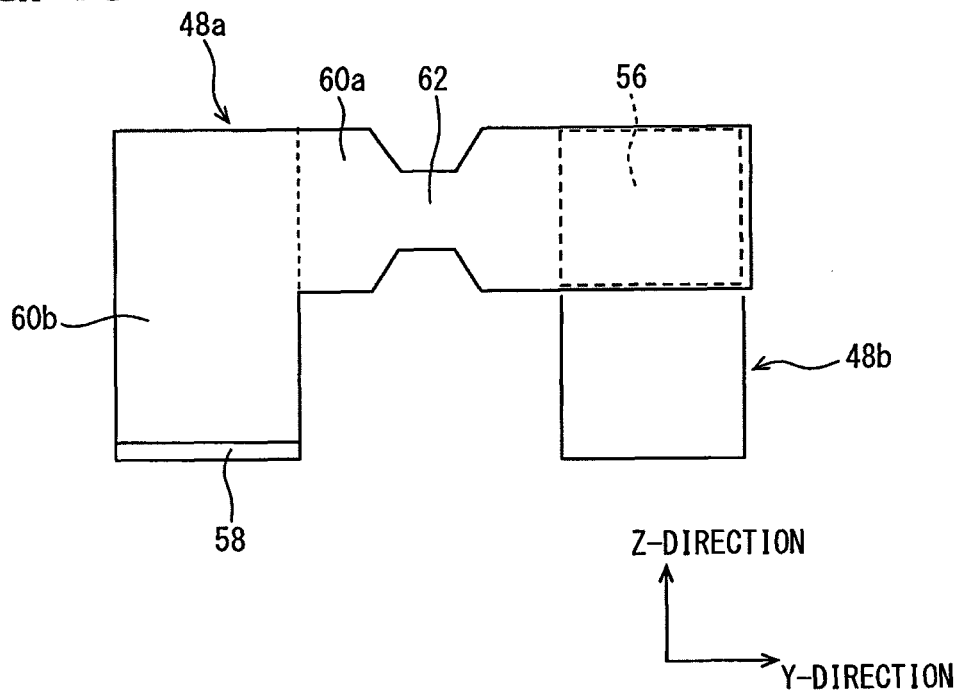
FIG. 13 is a schematic side view showing a fuse terminal of the fourth embodiment when viewed in a direction of an arrow in FIG. 12.

As shown in FIGS. 12 and 13, the first connecting portion 60a of the fuse terminal 48a is arranged on the same plane to that of the electrode-connected portion 56 and extends from the electrode-connected portion 56 in the Y-direction (that is, in the direction parallel to the board surface 26a). The other portions of the fourth embodiment are the same to those of the second embodiment.

The main body 46 has a rectangular shape on the plane defined by the X-direction and the Y-direction and its longitudinal direction corresponds to the X-direction. The fuse terminal 48a is connected to the electrode 50 formed on the first side surface 46c of the main body 46, while the normal terminal 48b is connected to the electrode 50 formed on the second side surface 46d.

As shown in FIG. 13, the fuse terminal 48a extends on the same plane to that of the electrode-connected portion 56 and extends from the electrode-connected portion 56 in the Y-direction. Therefore, the first connecting portion 60a is located at the same position to the electrode-connected portion 56 in the X-direction. A thickness direction of the first connecting portion 60a corresponds to the X-direction, as in the same manner to the electrode-connected portion 56. The terminal extending direction of the first connecting portion 60a is almost in parallel to the board surface 26*a* (that is, the Y-direction). The cut-off portion 62 is formed at a center of the first connecting portion 60*a*.

In FIG. 13, a boundary portion between the first connecting portion 60*a* and the second connecting portion 60*b* is indicated by a dotted line. The second connecting portion 60*b* extends from the first connecting portion 60*a* on the same plane to that of the first connecting portion 60*a* and in the Z-direction. The land-connected portion 58 is bent by an angle of almost 90 degrees with respect to the second connecting portion 60*b* and extends in the X-direction and in the direction away from (that is, opposite to) the main body 46.

According to the present embodiment, a first part of the fuse terminal 48*a* on the side to the land-connected portion 58 includes the land-connected portion 58, the second connecting portion 60*b* and a part of the first connecting portion 60*a* between the cut-off portion 62 and the second connecting portion 60*b*. A second part of the fuse terminal 48*a* on the side to the electrode-connected portion 56 includes the electrode connected portion 56 and a part of the first connecting portion 60*a*, which is located between the cut-off portion 62 and the electrode-connected portion 56. The first part of the fuse terminal 48*a* is formed at such a position, which is displaced from the second part of the fuse terminal 48*a* in the Y-direction, so that the first part of the fuse terminal 48*a* does not overlap with the second part of the fuse terminal 48*a* in the Y-direction and the Z-direction. According to the above structure, even when the main body 46 as well as the second part of the fuse terminal 48*a* (the part of the fuse terminal 48*a* on the side to the electrode-connected portion 56 from the gap 66) is rotated at the inner-side end 58*a* of the normal terminal 48*b* because of the melt-down of the cut-off portion 62 of the fuse terminal 48*a*, the main body 46 and the second part of the fuse terminal 48*a* are not brought into contact with the first part of the fuse terminal 48*a* (the part of the fuse terminal 48*a* on the side to the land-connected portion 58 from the gap 66). Accordingly, it is possible to more effectively prevent the possible re-connection of the fuse terminal 48*a*.

The structure of the fourth embodiment can be also applied to the first or the third embodiment.

(Fifth Embodiment)

A fifth embodiment will be explained with reference to FIG. 14. Explanation for those portions, which are similar to or the same to those of the first to the fourth embodiments (including the electronic part 28*a*, the electronic control unit 10 and so on), will be omitted.

Figure 14:
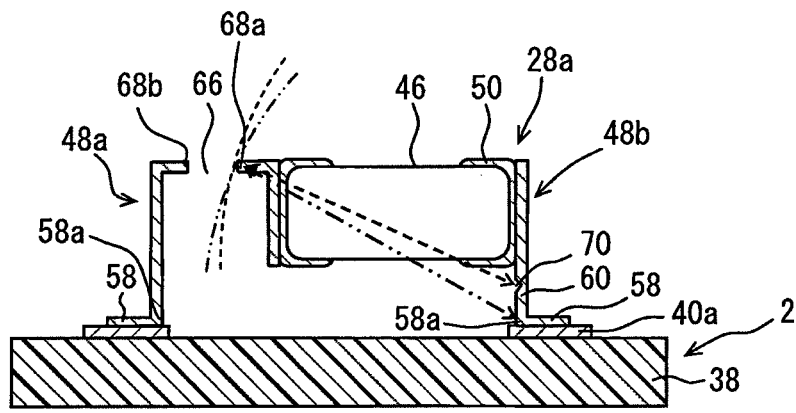
FIG. 14 is a schematic cross sectional view showing a part of a circuit board according to a fifth embodiment of the present disclosure, wherein FIG. 14 corresponds to FIG. 8.

As shown in FIG. 14, a notched portion 70 is formed in the intermediate portion 60 of the normal terminal 48*b*. More exactly, the notched portion 70 is formed on an inner-side surface of the normal terminal 48*b* in the X-direction, which is on a side to the main body 46 of the electronic part 28*a*. In addition, the notched portion 70 is formed at almost a center of the normal terminal 48*b* in the Z-direction between the electrode-connected portion 56 and the land-connected portion 58. The notched portion 70 extends in the Y-direction from one of the side portions of the intermediate portion 60 to the other of the side portions. The other remaining portions of the fifth embodiment are the same to those of the second embodiment.

As above, when the notched portion 70 is formed in the intermediate portion 60 of the normal terminal 48*b*, the notched portion 70 works as the starting point when the main body 46 and the part of the fuse terminal 48*a* on the side to the electrode-connected portion 56 is bent and/or rotated as a result of the melt-down of the cut-off portion 62. In FIG. 14, the rotational orbit of the first cut-off end 68*a* in a case of the inner-side end 58*a* of the normal terminal 48*b* working as the starting point is indicated by a two-dot-chain line, while a rotational orbit of the first cut-off end 68*a* in a case of the notched portion 70 working as the starting point is indicated by a dotted line. As shown in FIG. 14, a radius of rotation in the case of the notched portion 70 working as the starting point is smaller than that in the case of the inner-side end 58*a* working as the starting point. Accordingly, the size of the electronic part 28*a* can be made smaller.

In particular, when the notched portion 70 is formed at the inner-side surface of the intermediate portion 60 on the side to the main body 46 in the X-direction, the main body 46 as well as the part of the fuse terminal 48*a* on the side to the electrode-connected portion 56 is more likely to be bent in the X-direction, when the cut off portion 62 is melted down. It is, therefore, possible to control the direction in which the main body 46 is inclined or bent with respect to the board surface 26*a*.

The structure of the present embodiment can be also applied to the above first, the third and the fourth embodiments.

Figure 15:
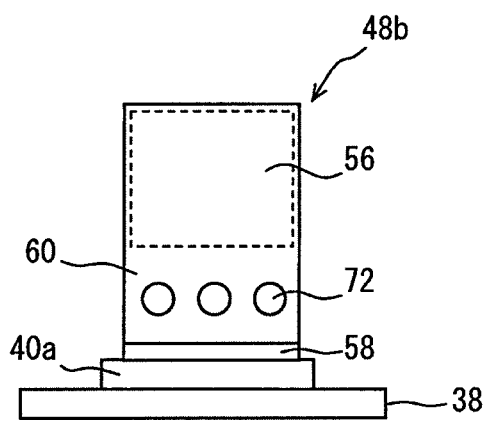
FIG. 15 is a schematic side view of a fuse terminal according to a first modification.

In a first modification shown in FIG. 15, multiple (for example, three) through-holes 72 are formed in the intermediate portion 60 of the fuse terminal 48*a* instead of the notched portion 70. According to the modification, it is possible to change the starting point of the bending movement of the normal terminal 48*b* to the position, which is higher than the inner-side end 58*a* of the land-connected portion 58. The notched portion 70 (FIG. 14) and the through-hole 72 (FIG. 15) are collectively referred to as a bending facilitation portion.

The present disclosure should not be limited to the above embodiments and/or modifications but can be further modified in various manners without departing from the spirit of the present disclosure.

In the above embodiments, only one of the terminals 48 is composed of the fuse terminal 48*a*. However, a number of the fuse terminal 48*a* should not be limited to one for one electronic part 28*a*. For example, all of the terminals 48 may be composed of the fuse terminals 48*a*.

In the electronic part 28*a* shown in FIG. 6A, the fuse terminal, which is the same to the fuse terminal 48*a* for the first side surface 46*c*, can be used for the second side surface 46*d*. Since the first cut-off end 68*a* and the second cut-off end 68*b* do not overlap with each other in the X-direction, the gap 66 remains between the first and second cut-off ends 68*a* and 68*b* when the cut-off portion 62 is melted down. Therefore, even when the cut-off portions 62 of both fuse terminals 48*a* are melted down, each of the gaps 66 can still remain between the first and second cut-off ends 68*a* and 68*b*. Therefore, when compared with the case in which the cut-off portion 62 is formed in the intermediate portion 60, which extends in the vertical direction (that is, in the Z-direction), it is possible in the modification of FIG. 6A to more effectively prevent the possible re-connection of the fuse terminal 48*a*.

Figure 16:
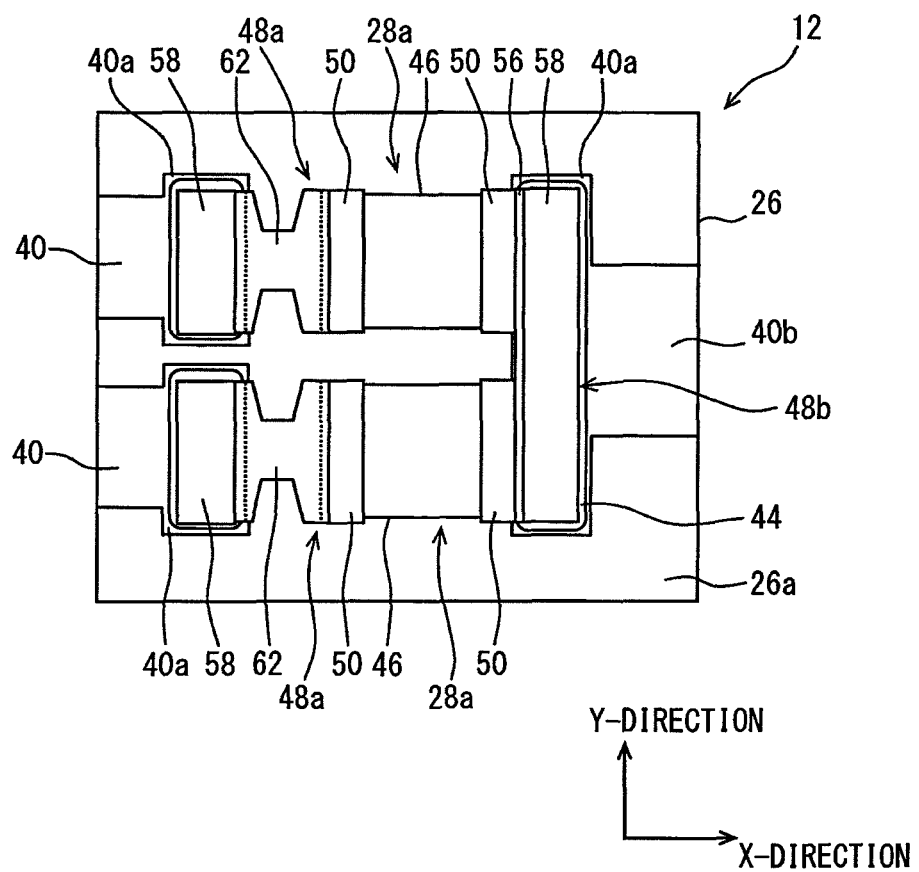
FIG. 16 is a schematically enlarged top plan view showing a portion of a printed board according to a second modification, wherein FIG. 16 corresponds to FIG. 3.

In the above embodiments, one terminal 48 is connected to one electrode 50. However, a number of terminals 48 to be connected to one electrode 50 should not be limited to one. For example, multiple fuse terminals 48*a* may be connected to one electrode 50. Alternatively, multiple normal terminals 48*b* may be connected to one electrode 50. In addition, as shown in FIG. 16 (a second modification), one normal terminal 48*b* may be commonly used for multiple (two in FIG. 16) electronic parts 28*a*.

In the above embodiments (for example, in the first embodiment), the ceramic-type laminated capacitor is explained as the example for the electronic part 28*a*. However, the above structures for the electronic part may be applied to any other types of the electronic elements. For example, a laminated inductor may be used as the electronic element having the laminated structure.

Furthermore, the structure for the terminals 48 may be applied to not only the electronic part of the laminated structure but also other electronic parts, such as a diode, a transistor, a resistor and so on. The present disclosure can be applied to the electronic part having more than two terminals.

In the above embodiments, the terminals 48 (the fuse terminal 48a and the normal terminal 48b) are connected to the printed board 26 by the surface mounting technology. The terminals 48 may be alternatively connected to the printed board 26 by a through-hole mounting technology.

In the above embodiments, the electronic part 28a having the fuse terminal 48a is electrically connected to the power-source wiring pattern 40b (connected to the battery 36) via the land 40a and the connecting wiring pattern 40c. However, the electronic part 28a having the fuse terminal 48a may be electrically connected to other wiring patterns than the power-source wiring pattern.

The shape of the main body 46 on the plane defined by the X-direction and the Y-direction should not be limited to the rectangular shape.

What is claimed is:

1. An electronic part mounted to a printed board comprising:
    a main body arranged at a position above and separated from a board surface of the printed board, the main body having at least one electronic element and multiple electrodes for the electronic element; and
    multiple terminals, each of which is connected at its one end to each of the electrodes and electrically and mechanically connected at its other end to a land formed in the printed board, each of the terminals extending from the main body toward the printed board so as to hold the main body at the position above and separated from the board surface in a condition that each of the terminals is electrically and mechanically connected to the respective electrodes and the respective lands;
    wherein each of the terminals has an electrode-connected portion electrically and mechanically connected to the corresponding electrode, a land-connected portion electrically and mechanically connected to the corresponding land, and an intermediate portion for connecting the electrode-connected portion and the land-connected portion with each other,
    wherein the terminals include at least one fuse terminal,
    wherein the fuse terminal has a first connecting portion at least as a part of the intermediate portion, the first connecting portion extending in a direction parallel to the board surface or in a direction inclined with respect to the board surface by an angle smaller than 90 degrees,
    wherein the fuse terminal further has a cut-off portion formed in the first connecting portion,
    wherein the cut-off portion, which has a width smaller than that of other portions of the fuse terminal, is melted down due to heat generation by excess current, and
    wherein the fuse terminal has tapered portions at both sides of the cut-off portion, so that the cut-off portion is respectively connected to the electrode-connected portion and the land-connected portion via the respective tapered portions.

2. The electronic part according to claim 1, wherein
    the fuse terminal has a second connecting portion extending in a direction perpendicular to the board surface as another part of the intermediate portion,
    the second connecting portion is connected to the first connecting portion,
    the electrode-connected portion is formed on a side of the first connecting portion opposite to the second connecting portion, and
    the land-connected portion is formed on a side of the second connecting portion opposite to the first connecting portion.

3. The electronic part according to claim 2, wherein
    the first connecting portion extends from the electrode-connected portion in a direction opposite to the main body, and
    the land-connected portion is bent by a predetermined angle with respect to the second connecting portion and extends from the second connecting portion in a direction opposite to the first connecting portion.

4. The electronic part according to claim 1, wherein
    the terminals include at least one normal terminal, which has a cross sectional area larger than that of the cut-off portion for an entire length of the normal terminal,
    the main body has a rectangular shape on a plane extending along the board surface,
    each of the terminals is connected to the respective electrodes, each of which is formed on each of corresponding side surfaces of the main body opposing to each other,
    only the fuse terminal is connected to the electrode formed on one of the side surfaces, and
    at least one normal terminal is connected to the electrode formed on the other of the side surfaces.

5. The electronic part according to claim 4, wherein
    the normal terminal has an intermediate portion extending in a direction, which is on the same plane to that of the electrode-connected portion of the normal terminal and which is perpendicular to the board surface,
    the normal terminal has a land-connected portion, which is bent by a predetermined angle with respect to the intermediate portion of the normal terminal and extends from the intermediate portion of the normal terminal in a direction opposite to the main body, and
    the fuse terminal satisfies a dimensional relationship of "L2 >L1",
    wherein "L1" is a distance between a starting point and a long-distance point,
    the starting point corresponds to an inner-side end of the land-connected portion of the normal terminal in a direction, in which the opposing side surfaces of the main body are arranged,
    the long-distance point corresponds to a point of the main body or a point of a part of the fuse terminal fixed to and remaining on a side to the main body when the cut-off portion is melted down, whichever is farthest from the starting point,
    "L2" is a distance between the starting point and a short-distance point, and
    the short-distance point corresponds to a point of another part of the fuse terminal fixed to and remaining on a side to the land when the cut-off portion is melted down, which is closest to the starting point.

6. The electronic part according to claim 5, wherein
    the first connecting portion is connected to an upper end of the electrode-connected portion of the fuse terminal, wherein the upper end is more remote from the board surface than a lower end of the electrode-connected portion in the direction perpendicular to the board surface.

7. The electronic part according to claim 5, wherein
    the first connecting portion is connected to a lower end of the electrode-connected portion of the fuse terminal, wherein the lower end is closer to the board surface than an upper end of the electrode-connected portion in the direction perpendicular to the board surface.

8. The electronic part according to claim 2, wherein
the first connecting portion is formed on the same plane to that of the electrode-connected portion and extends from the electrode-connected portion in a direction parallel to the board surface.

9. The electronic part according to claim 8, wherein
the terminals include at least one normal terminal, which has a cross sectional area larger than that of the cut-off portion for an entire length of the normal terminal,
the main body has a rectangular shape on a plane extending along the board surface,
each of the terminals is connected to the respective electrodes, each of which is formed on each of corresponding side surfaces of the main body opposing to each other, only the fuse terminal is connected to the electrode formed on one of the side surfaces, and
at least one normal terminal is connected to the electrode formed on the other of the side surfaces.

10. The electronic part according to claim 4, wherein
the normal terminal has a bending-facilitation portion at the intermediate portion of the normal terminal.

11. The electronic part according to claim 10, wherein
the bending-facilitation portion is formed on an inner-side surface of the intermediate portion of the normal terminal, wherein the inner-side surface of the intermediate portion for the bending-facilitation portion is a surface formed on a side to the main body in a direction in which the side surfaces of the main body are arranged.

12. An electronic control unit comprising:
the electronic part according to claim 1; and
the printed board having the land connected to the terminal of the electronic part.

* * * * *